(12) United States Patent
Miller et al.

(10) Patent No.: US 9,762,238 B1
(45) Date of Patent: Sep. 12, 2017

(54) SYSTEMS AND METHODS FOR SUPPLYING REFERENCE VOLTAGE TO MULTIPLE DIE OF DIFFERENT TECHNOLOGIES IN A PACKAGE

(71) Applicant: NXP USA, Inc., Austin, TX (US)

(72) Inventors: Gary L. Miller, Austin, TX (US); Michael E. Gladden, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/478,000

(22) Filed: Apr. 3, 2017

(51) Int. Cl.
*H03K 19/0175* (2006.01)
*H03K 19/00* (2006.01)

(52) U.S. Cl.
CPC . *H03K 19/0008* (2013.01); *H03K 19/017509* (2013.01)

(58) Field of Classification Search
CPC ......... H03K 19/00369; H03K 19/0175; H03K 19/017509
See application file for complete search history.

(56) References Cited

U.S. PATENT DOCUMENTS

| | | | |
|---|---|---|---|
| 9,298,201 | B2 | 3/2016 | Mathiyalagan et al. |
| 9,614,526 | B1* | 4/2017 | Kapoor .......... H03K 19/017509 |
| 2008/0186798 | A1* | 8/2008 | Chu .................... H01L 25/0657 |
| | | | 365/230.03 |
| 2015/0280709 | A1* | 10/2015 | Cho ................... H03K 19/0005 |
| | | | 326/30 |

FOREIGN PATENT DOCUMENTS

WO    2008042595 A2    4/2008

\* cited by examiner

*Primary Examiner* — Jason M Crawford

(57) ABSTRACT

A system in a package (SIP) has a first die with a first internal voltage level, first die-to-die output circuitry, first die-to-die input circuitry, and first internal logic and a second die with a second internal voltage level, second die-to-die output circuitry, second die-to-die input circuitry, and second internal logic. A first signal is provided to the second internal logic via the first die-to-die output circuitry and the second die-to-die input circuitry, wherein each of the first die-to-die output circuitry and second die-to-die input circuitry selectively level shift the first signal based on the first and second internal voltage levels. A second signal is provided to the first internal logic via the second die-to-die output circuitry and the first die-to-die input circuitry, wherein each of the second die-to-die output circuitry and first die-to-die input circuitry selectively level shift the second signal based on the first and second internal voltage levels.

20 Claims, 2 Drawing Sheets

SYSTEMS AND METHODS FOR SUPPLYING REFERENCE VOLTAGE TO MULTIPLE DIE OF DIFFERENT TECHNOLOGIES IN A PACKAGE

BACKGROUND

Field

This disclosure relates generally to integrated circuits, and more specifically, to systems and methods for supplying reference voltage to multiple die of different technologies in a package.

Related Art

Trends in the semiconductor industry are leading to a migration towards System-in-Package (SiP) products. These trends include rising mask costs, which could exceed $10 million in the next few years. In addition, uneven technology shrink factors make some circuit types more cost effective in older technology nodes, given high wafer costs for technology nodes below 20 nanometers (NM). Another trend is planar bulk-transistor topology reaching the end of life, which results in more severe leakage, performance, capability and cost trade-offs. Further, new transistor topologies below 20 nm such as FinFET and others may not be effective solutions for all circuit types. Additionally, Moore's law is challenged because of extreme single-die complexities causing increased R&D costs and project durations.

SiPs allow for new paradigms of optimization to solve trade-offs of leakage, performance, capability and cost. SiPs can even help manage complexity using a divide-and-conquer strategy. SiPs also present new challenges, however, including the fact that existing pad structures intended for package I/O and chip-to-chip communication via standards such as PCI Express, are not cost, frequency, latency, or power efficient.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Systems and methods disclosed herein provide systems-in-packages (SiPs) manufactured in different technology nodes that use different internal operating voltages or are purposely operated at a lower voltage to conserve power. Signal input and output circuits that can be used to provide different reference voltage configurations are included on the die. A SiP signal output circuit on one die is connected to a SiP input circuit on the other die, and vice versa. The SiP signal circuits provide inputs and outputs to internal logic on their respective die, for the purpose of communicating signal information between internal logic. The internal operating voltage of each die is provided to the other die. The lower of the two internal operating voltages will be selected as the voltage level for all signal communication between the two die. Using the lowest internal voltage level eliminates gate voltage over-stress for smaller technology transistors while resulting in the lowest power solution. In an alternate embodiment the higher of the two internal operating voltages will be selected as the voltage level for all signal communication between the two die. Using the higher of the two provides better noise immunity and provides in more performance in future shrinking technologies.

The technology die expected to operate with the lower internal voltage level connects its SiP signal circuits to its internal voltage level only. The technology die expected to operate with the higher internal voltage level connects its SiP signal circuits to its internal operating voltage and a voltage level provided by the other SiP die. The voltage level provided by the other SiP die is used to communicate signals directly between the two die. If both die are expected to operate with the same internal voltage level the respective SiP signal circuits are connected to the die's internal voltage level. The selection method used during SiP assembly or power-up may be implemented on one of the die, both die, or external to both die. The internal logic supply level on each die will be different in many SiP configurations. When building and managing an inventory of SiP die for expansion purposes (e.g., SRAM memory expansion die), systems and methods disclosed herein allow the expansion die to be re-used with other die that operate using lower, the same, or higher supply levels.

In an alternate embodiment the technology die expected to operate with the higher internal voltage level connects its SiP signal circuits to its internal voltage level only. The technology die expected to operate with the lower internal voltage connects its SiP signal circuits to its internal operating voltage and a voltage level provided by the other SiP die. The voltage level provided by the other SiP die is used to communicate signals directly between the two die.

Figure 1:
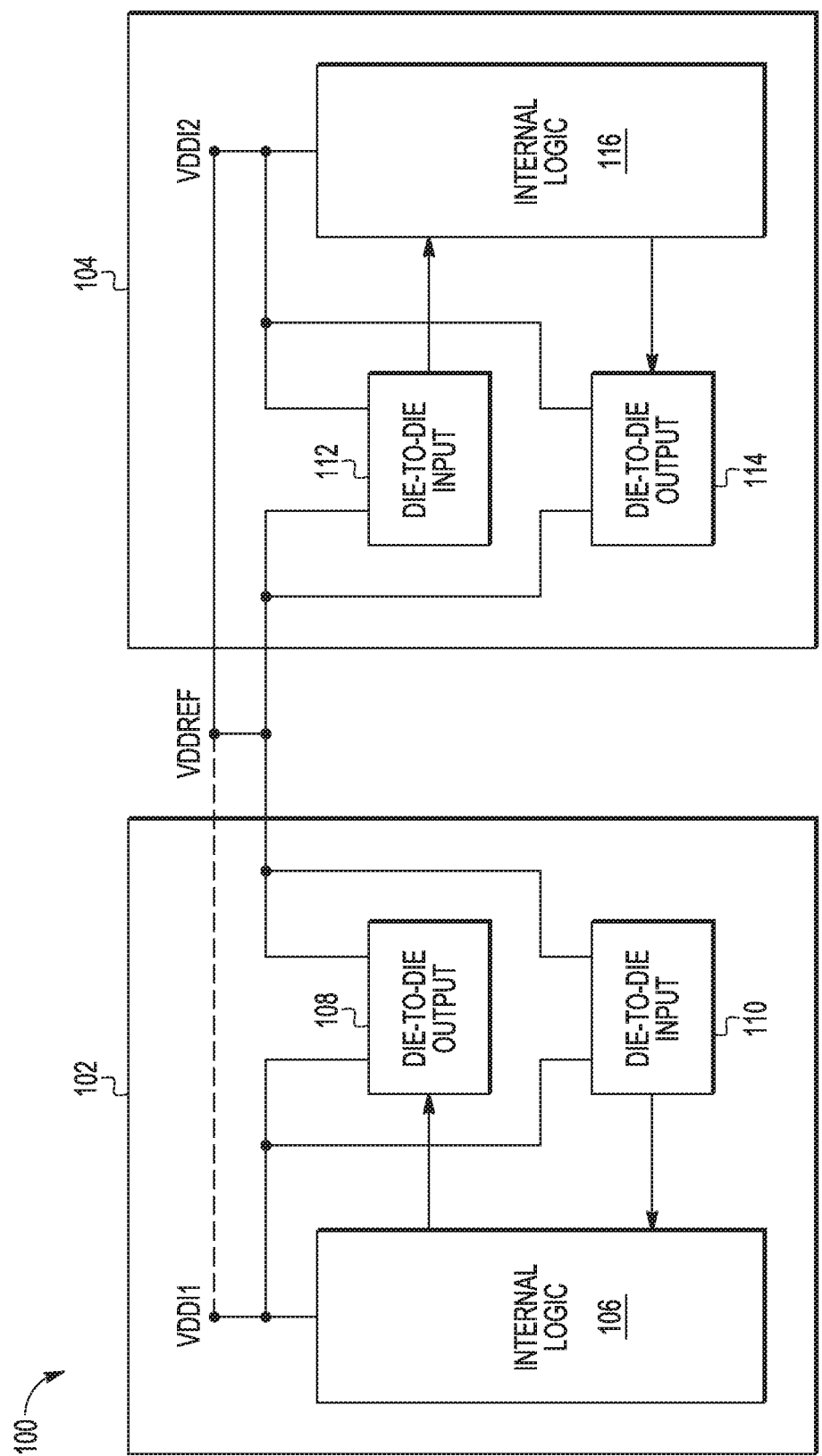
FIG. 1 is a block diagram of a system-in-package (SiP) in accordance with selected embodiments of the invention.

FIG. 1 is a block diagram of system-in-package (SiP) 100 in accordance with selected embodiments of the invention that includes first die 102 and second die 104. Die 102 includes internal logic 106, die-to-die output circuitry 108, and die-to-die input circuitry 110. Internal logic 106 is coupled to first supply voltage terminal VDDI1, to provide signals to die-to-die output circuitry 108, and to receive signals from die-to-die input circuitry 110. Supply voltage terminal VDDI1 is also coupled to die-to-die output circuitry 108 and die-to-die output circuitry 110.

Die 104 includes internal logic 116, die-to-die input circuitry 112, and die-to-die output circuitry 114. Internal logic 116 is coupled to second supply voltage terminal VDDI2, to provide signals to die-to-die output circuitry 114, and to receive signals from die-to-die input circuitry 112. Supply voltage terminal VDDI2 is also coupled to die-to-die output circuitry 114 and die-to-die output circuitry 112.

Die-to-die output circuitry 108 on die 102 is coupled to provide signals to die-to-die input circuitry 112 on die 104. Die-to-die input circuitry 110 on die 102 is coupled to receive signals from die-to-die output circuitry 114 on die 104. Die 102 can be made using a different technology node than die 104. The term "technology node" refers to the process used to manufacture complementary metal-oxide semiconductor (CMOS) integrated circuits such as die 102 and 104. In general, the smaller the technology node, the lower the voltage used to operate the circuits. Operating circuitry at a voltage higher than specified for a particular technology node can damage or shorten the life of circuit elements, such as transistors, in die 102, 104. Thus, when die 102 is made using a different technology node than die 104, SiP 100 allows internal logic 106, 116 in each die 102, 104 to operate at different voltages while the voltage levels of signals passed between die 102 and 104 are shifted to a level required by respective die 102, 104. Note that die 102, 104 can include processing circuitry, memory, sensors, and/or other suitable integrated circuitry.

In a first configuration as shown by a dashed line coupling reference voltage VDDREF to supply voltage terminal VDDI1, reference voltage VDDREF is also coupled to die-to-die output circuitry 108, die-to-die input circuitry 110, die-to-die input circuitry 112, and die-to-die output circuitry 114. When supply voltage VDDI1 is greater than supply voltage VDDI2, reference voltage VDDREF is the same as supply voltage VDDI2. Die-to-die output circuitry 108 shifts the voltage of signals from internal logic 106 at a level of supply voltage VDDI1 to a level of reference voltage VDDREF. The level shifted signals are then supplied to die-to-die input circuitry 112 and internal logic 116 on die 104. The voltage level of signals from die-to-die output circuitry 108 are at a level that will not impair circuit components of die 104. Die-to-die output circuitry 114 sends signals from internal logic 116 to die-to-die input circuitry 110 on die 102. Die-to-die input circuitry 110 shifts the voltage of signals from internal logic 116 from the level of supply voltage VDDI2 to the level of reference voltage VDDREF. The level shifted signals are then supplied to internal logic 106 on die 102 at the level required by internal logic 106.

In an alternate embodiment when supply voltage VDDI1 is less than supply voltage VDDI2, reference voltage VDDREF is the same as supply voltage VDDI2. Die-to-die output circuitry 108 shifts the voltage of signals from internal logic 106 at a level of supply voltage VDDI1 to a level of reference voltage VDDREF. The level shifted signals are then supplied to die-to-die input circuitry 112 and internal logic 116 on die 104. The voltage level of signals from die-to-die output circuitry 108 are at a level that is compatible with circuit components of die 104. Die-to-die output circuitry 114 sends signals from internal logic 116 to die-to-die input circuitry 110 on die 102. Die-to-die input circuitry 110 shifts the voltage of signals from internal logic 116 from the level of supply voltage VDDI2 to the level of reference voltage VDDREF. The level shifted signals are then supplied to internal logic 106 on die 102 at the level required by internal logic 106.

System 100 can also be used in a second configuration as shown by a solid line coupling reference voltage VDDREF to supply voltage terminal VDDI2. Note that the dashed line between reference voltage VDDREF and supply voltage terminal VDDI1 will be removed in the second configuration. Reference voltage VDDREF will also be coupled to die-to-die output circuitry 108, die-to-die input circuitry 110, die-to-die input circuitry 112, and die-to-die output circuitry 114. When supply voltage VDDI2 is greater than supply voltage VDDI1, reference voltage VDDREF is the same as supply voltage VDDI1. Die-to-die output circuitry 114 shifts the voltage of signals from internal logic 116 at a level of supply voltage VDDI2 to a level of reference voltage VDDREF. The level shifted signals are then supplied to die-to-die input circuitry 110 and internal logic 106 on die 102. Die-to-die input circuitry 112 shifts the voltage of signals from die-to-die output circuitry 108 from the level of supply voltage VDDI1 to the level of reference voltage VDDREF. The level shifted signals are then supplied to internal logic 116 on die 104 at the level required by internal logic 116.

In an alternate embodiment when supply voltage VDDI2 is less than supply voltage VDDI1, reference voltage VDDREF is the same as supply voltage VDDI1. Die-to-die output circuitry 114 shifts the voltage of signals from internal logic 116 at a level of supply voltage VDDI2 to a level of reference voltage VDDREF. The level shifted signals are then supplied to die-to-die input circuitry 110 and internal logic 106 on die 102. Die-to-die input circuitry 112 shifts the voltage of signals from die-to-die output circuitry 108 from the level of supply voltage VDDI1 to the level of reference voltage VDDREF. The level shifted signals are then supplied to internal logic 116 on die 104 at the level required by internal logic 116.

Figure 2:
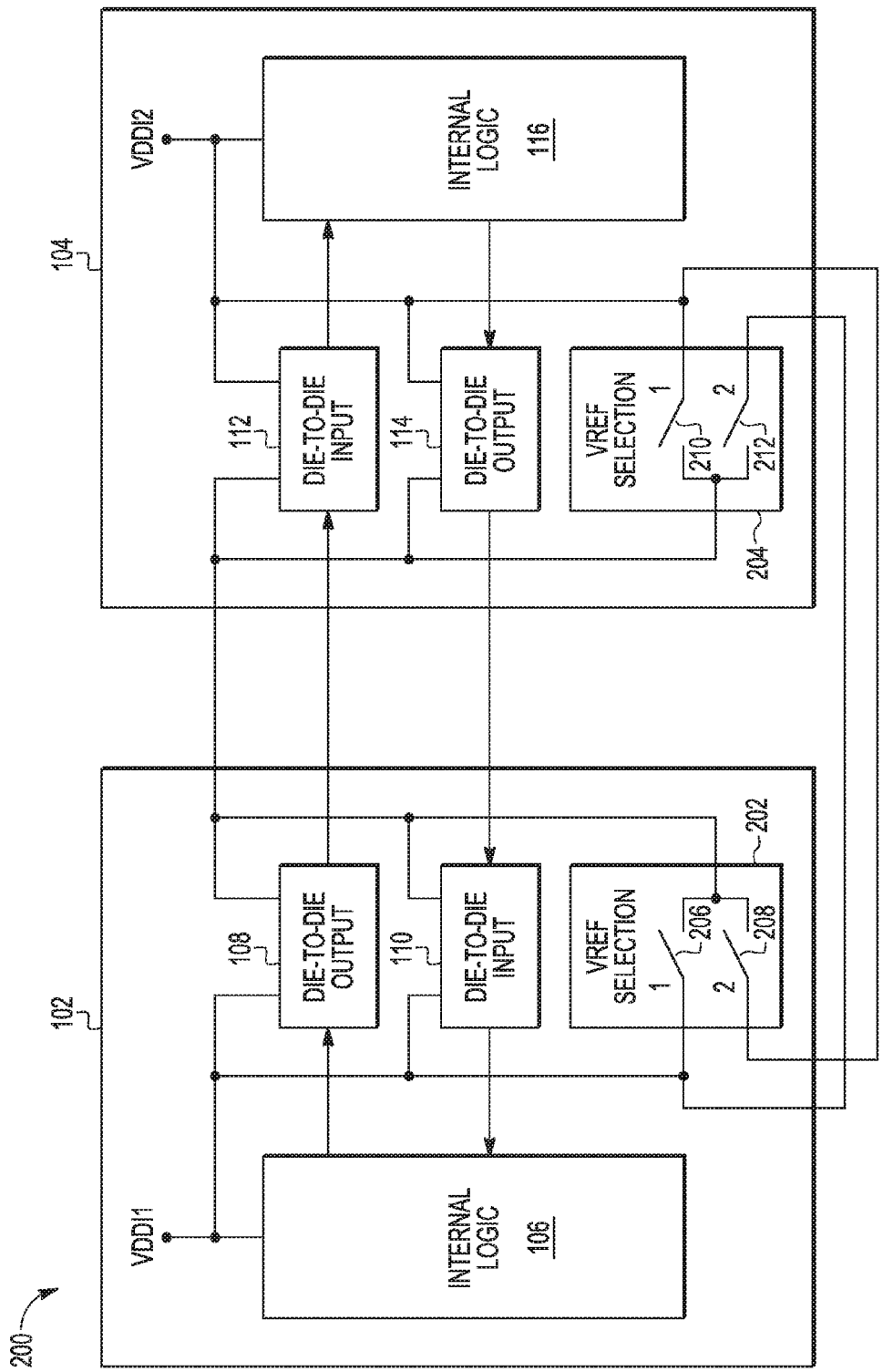
FIG. 2 is a block diagram of another SiP in accordance with other selected embodiments of the invention.

FIG. 2 is a block diagram of another system-in-package (SiP) 200 in accordance with other selected embodiments of the invention that includes first die 102 and second die 104. Die 102 includes internal logic 106, die-to-die output circuitry 108, die-to-die input circuitry 110, and reference voltage selection circuitry 202. Die 104 includes internal logic 116, die-to-die input circuitry 112, die-to-die output circuitry 114, and reference voltage selection circuitry 204.

Internal logic 106 is coupled to first supply voltage terminal VDDI1, to provide signals to die-to-die output circuitry 108, and to receive signals from die-to-die input circuitry 110. Supply voltage terminal VDDI1 is also coupled to die-to-die output circuitry 108, die-to-die input circuitry 110, and to a first terminal of switch 206 in reference voltage selection circuitry 204. A second terminal of switch 206 is coupled to die-to-die input circuitry 110 and die-to-die output circuitry 108. Reference voltage selection circuitry 202 further includes switch 208 with a first terminal coupled to a first terminal of switch 210 in reference voltage selection circuitry 204 and a second terminal coupled to die-to-die input circuitry 110 and die-to-die output circuitry 108. Die-to-die output circuitry 108 on die 102 is coupled to provide signals to die-to-die input circuitry 112 on die 104. Die-to-die output circuitry 114 on die 104 is coupled to provide signals to die-to-die input circuitry 110 on die 102.

Internal logic 116 is coupled to second supply voltage terminal VDDI2, to provide signals to die-to-die output circuitry 114, and to receive signals from die-to-die input circuitry 112. Supply voltage terminal VDDI2 is also coupled to die-to-die output circuitry 114, die-to-die input circuitry 112, and to a first terminal of switch 210 in reference voltage selection circuitry 204. A second terminal of switch 210 is coupled to die-to-die output circuitry 114 and die-to-die input circuitry 112. Reference voltage selection circuitry 204 further includes switch 212 with a first terminal coupled to a first terminal of switch 206 in reference voltage selection circuitry 202 and a second terminal coupled to die-to-die input circuitry 110 and die-to-die output circuitry 108.

Since die 102 can be made using a different technology node than die 104, SiP 200 allows internal logic 106, 116 in each die 102, 104 to operate at different voltages while the voltage levels of signals passed between die 102 and 104 are shifted to a level required by respective die 102, 104 through the operation of reference voltage selection circuitry 202, 204.

In a first configuration, when supply voltage VDDI1 is greater than supply voltage VDDI2, switch 206 in reference voltage selection circuitry 202 is open and switch 208 is closed. Simultaneously, switch 210 in reference voltage selection circuitry 204 is closed and switch 212 is open. The position of switches 206-212 causes supply voltage VDDI1 to be used in die-to-die output circuitry 108 to shift the voltage of signals from internal logic 106 at a level of supply voltage VDDI1 to a level of supply voltage VDDI2. The level shifted signals are then supplied to die-to-die input circuitry 112 and internal logic 116 on die 104. The voltage level of signals from die-to-die output circuitry 108 are at a level that will not impair circuit components of die 104. Die-to-die output circuitry 114 sends signals from internal logic 116 to die-to-die input circuitry 110 on die 102. Die-to-die input circuitry 110 shifts the voltage of signals from internal logic 116 from the level of supply voltage VDDI2 to the level of supply voltage VDDI1. The level shifted signals are then supplied to internal logic 106 on die 102 at the level required by internal logic 106.

In an alternate embodiments when supply voltage VDDI1 is less than supply voltage VDDI2, switch 206 in reference voltage selection circuitry 202 is open and switch 208 is closed. Simultaneously, switch 210 in reference voltage selection circuitry 204 is closed and switch 212 is open. The position of switches 206-212 causes supply voltage VDDI1 to be used in die-to-die output circuitry 108 to shift the voltage of signals from internal logic 106 at a level of supply voltage VDDI1 to a level of supply voltage VDDI2. The level shifted signals are then supplied to die-to-die input circuitry 112 and internal logic 116 on die 104. The voltage level of signals from die-to-die output circuitry 108 are at a level that will not impair circuit components of die 104. Die-to-die output circuitry 114 sends signals from internal logic 116 to die-to-die input circuitry 110 on die 102. Die-to-die input circuitry 110 shifts the voltage of signals from internal logic 116 from the level of supply voltage VDDI2 to the level of supply voltage VDDI1. The level shifted signals are then supplied to internal logic 106 on die 102 at the level required by internal logic 106.

System 200 can also be used in a second configuration when supply voltage VDDI2 is greater than supply voltage VDDI1, switch 206 in reference voltage selection circuitry 202 is closed and switch 208 is open. Simultaneously, switch 210 in reference voltage selection circuitry 204 is open and switch 212 is closed. The position of switches 206-212 causes supply voltage VDDI2 to be used in die-to-die output circuitry 114 to shift the voltage of signals from internal logic 116 at a level of supply voltage VDDI2 to a level of supply voltage VDDI1. Die-to-die input circuitry 112 shifts the voltage of signals from internal logic 116 at a level of supply voltage VDDI2 to a level of supply voltage VDDI1. The level shifted signals are then supplied to die-to-die input circuitry 110 and internal logic 106 on die 102. Die-to-die input circuitry 112 shifts the voltage of signals from die-to-die output circuitry 108 from the level of supply voltage VDDI1 to the level of supply voltage VDDI2. The level shifted signals are then supplied to internal logic 116 on die 104 at the level required by internal logic 116.

In an alternate embodiment when supply voltage VDDI2 is less than supply voltage VDDI1, switch 206 in reference voltage selection circuitry 202 is closed and switch 208 is open. Simultaneously, switch 210 in reference voltage selection circuitry 204 is open and switch 212 is closed. The position of switches 206-212 causes supply voltage VDDI2 to be used in die-to-die output circuitry 114 to shift the voltage of signals from internal logic 116 at a level of supply voltage VDDI2 to a level of supply voltage VDDI1. Die-to-die input circuitry 112 shifts the voltage of signals from internal logic 116 at a level of supply voltage VDDI2 to a level of supply voltage VDDI1. The level shifted signals are then supplied to die-to-die input circuitry 110 and internal logic 106 on die 102. Die-to-die input circuitry 112 shifts the voltage of signals from die-to-die output circuitry 108 from the level of supply voltage VDDI1 to the level of supply voltage VDDI2. The level shifted signals are then supplied to internal logic 116 on die 104 at the level required by internal logic 116.

By now it should be appreciated that instead of implementing package I/O on both die or level shifters on only one die, embodiments disclosed herein implement die-to-die output circuitry 108, 114 and die-to-die shift input circuitry 110, 112 to handle communication between die 102, 104 that use different operating voltages. Die-to-die output circuitry 108, 114 and die-to-die input circuitry 110, 112 are connected to internal logic circuitry 106, 116 on each respective die 102, 104 to provide signals to the other die, and to provide a received signal from the other die to the internal logic circuitry 106, 116, respectively. The voltage level for signals between die 102, 104 is selected to be the lowest internal voltage level of the two die's internal voltage levels. Using the lowest internal voltage level eliminates gate voltage over-stress for smaller technology transistors while resulting in the highest performance and lowest power solution. Die-to-die output circuitry 108, 114 provides power signals to the other die at its internal logic voltage level, or down-shifting to an alternative voltage level before driving the power signal. Die-to-die input circuitry 110, 112 on both die is capable of receiving the other die's signal at its internal logic voltage level, or up-shifting from an alternative voltage level to its internal logic level before receiving the signal. In this manner, a manufactured die in inventory may be configured during assembly or at power-up to work robustly and efficiently with a second die operating at a lower or higher internal logic voltage level than its own.

In selected embodiments, a system in a package (SIP) can include a first die (102) having a first supply voltage terminal (VDDI1) configured to provide a first internal voltage level, first die-to-die output circuitry (108), first die-to-die input circuitry (110), and first internal logic (106) coupled to the first supply voltage terminal. A second die can have a second supply voltage terminal (VDDI2) configured to provide a second internal voltage level, second die-to-die output circuitry (114), second die-to-die input circuitry (112), and second internal logic (116) coupled to the second supply voltage terminal. The first internal logic can be configured to provide a first signal to the second internal logic via the first die-to-die output circuitry and the second die-to-die input circuitry, wherein each of the first die-to-die output circuitry and second die-to-die input circuitry are configured to selectively level shift the first signal based on the first and second internal voltage levels. The second internal logic can be configured to provide a second signal to the first internal logic via the second die-to-die output circuitry and the first die-to-die input circuitry, wherein each of the second die-to-die output circuitry and first die-to-die input circuitry are configured to selectively level shift the second signal based on the first and second internal voltage levels.

In other aspects, a first power terminal of each of the first die-to-die output circuitry and first die-to-die input circuitry can be coupled to the first supply voltage terminal and a first power terminal of the second die-to-die output circuitry and second die-to-die input circuitry can be coupled to the second supply voltage terminal.

In other aspects, the first die can further comprise first selection circuitry configured to, based on the first and second internal voltage levels, couple one of the first supply voltage terminal or the second supply voltage terminal to a second power terminal of each of the first die-to-die output circuitry and first die-to-die input circuitry. The second die can further comprise second selection circuitry configured to, based on the first and second internal voltage levels, couple one of the first supply voltage terminal or the second supply voltage terminal to a second power supply terminal of each of the second die-to-die output circuitry and second die-to-die input circuitry.

In other aspects, when the second internal voltage level is greater than the first internal voltage level the first selection circuitry can be configured to couple the second supply voltage terminal to the second power terminal of each of the first die-to-die output circuitry and first die-to-die input circuitry, and (closing switch 208) the second selection circuitry can be configured to couple the second supply voltage terminal to the second power terminal of each of the second die-to-die output circuitry and second die-to-die input circuitry (closing switch 210).

In other aspects, when the second internal voltage level is greater than the first internal voltage level the first selection circuitry can be configured to also decouple the first supply voltage terminal from the second power terminal of each of the first die-to-die output circuitry and first die-to-die input circuitry (opening switch 206), and the second selection circuitry can be configured to also decouple the first supply voltage terminal from the second power terminal of each of the second die-to-die output circuitry and second die-to-die input circuitry (opening switch 212).

In other aspects, when the first internal voltage level is greater than the second internal voltage level, the first selection circuitry can be configured to couple the first supply voltage terminal to the second power terminal of each of the first die-to-die output circuitry and first die-to-die input circuitry, and (closing switch 206) the second selection circuitry can be configured to couple the first supply voltage terminal to the second power terminal of each of the second die-to-die output circuitry and second die-to-die input circuitry (closing switch 212).

In other aspects, when the second internal voltage level is greater than the first internal voltage level, the first die-to-die output circuitry (108) can be configured to up shift the first signal from the first internal voltage level (VDDI1) to the second internal voltage level (VDDI2) prior to providing the first signal to the second die-to-die input circuitry (112), and the second die-to-die input circuitry can provide the first signal to the second internal logic without level shifting the first signal.

In other aspects, when the second internal voltage level is greater than the first internal voltage level, the second die-to-die output circuitry (114) can be configured to provide the second signal at the second internal voltage level without level shifting, and the first die-to-die input circuitry (110) can be configured to down shift the second signal from the second internal voltage level to the first internal voltage level prior to providing the second signal to the first internal logic.

In other aspects, when the first internal voltage level is greater than the second internal voltage level, the second die-to-die output circuitry (114) can be configured to up shift the second signal from the second internal voltage level (VDDI2) to the first internal voltage level (VDDI1) prior to providing the second signal to the first die-to-die input circuitry (108), and the first die-to-die input circuitry (110) can provide the second signal to the first internal logic without level shifting the second signal.

In other aspects, when the first internal voltage level is greater than the second internal voltage level, the first die-to-die output circuitry (108) can be configured to provide the first signal at the first internal voltage level without level shifting, and the second die-to-die input circuitry (112) can be configured to down shift the first signal from the first internal voltage level to the second internal voltage level prior to providing the first signal to the second internal logic.

In other aspects, the first selection circuitry can comprise: a first switch (206) can be configured to selectively couple the first supply voltage terminal to the second power terminal of each of the first die-to-die input circuitry and the first die-to-die output circuitry, and a second switch (208) can be configured to selectively couple the second supply voltage terminal to the second power terminal of each of the first die-to-die input circuitry and the first die-to-die output circuitry. The second selection circuitry can comprise a first switch (210) configured to selectively couple the second supply voltage terminal to the second power terminal of each of the second die-to-die input circuitry and the second die-to-die output circuitry, and a second switch (212) configured to selectively couple the first supply voltage terminal to the second power terminal of each of the second die-to-die input circuitry and the second die-to-die output circuitry.

In other aspects, when the second internal voltage level is greater than the first internal voltage level, the first selection circuitry can be configured to close the second switch (208) of the first selection circuitry and open the first switch (206) of the first selection circuitry, and the second selection circuitry can be configured to close the first switch (210) of the second selection circuitry and open the second switch (212) of the second selection circuitry.

In other aspects, when the first internal voltage level is greater than the second internal voltage level, the first selection circuitry can be configured to open the second switch (208) of the first selection circuitry and close the first switch (206) of the first selection circuitry, and the second selection circuitry can be configured to open the first switch (210) of the second selection circuitry and close the second switch (212) of the second selection circuitry.

In other selected embodiments, a system in a package (SIP) can comprise a first die (102) having a first supply voltage terminal (VDDI1) configured to provide a first internal voltage level, first die-to-die output circuitry (108) having a first power terminal and a second power terminal, first die-to-die input circuitry (110) having a first power terminal and a second power terminal, and first internal logic (106) coupled to the first supply voltage terminal. A second die can have a second supply voltage terminal (VDDI2) configured to provide a second internal voltage level. Second die-to-die output circuitry (114) can have a first power terminal and a second power terminal, second die-to-die input circuitry (112) can have a first power terminal and a second power terminal, and second internal logic (116) can be coupled to the second supply voltage terminal. A reference terminal can be external to the first and second die. The first power terminal of each of the first die-to-die output circuitry and first die-to-die input circuitry can be coupled to the first supply voltage terminal, the first power terminal of the second die-to-die output circuitry and second die-to-die input circuitry can be coupled to the second supply voltage terminal, and the second power terminal of each of the first die-to-die output circuitry, first die-to-die input circuitry, second die-to-die output circuitry, and second die-to-die input circuitry can be coupled to the reference terminal.

In other aspects, the first internal logic can be configured to provide a first signal to the second internal logic via the first die-to-die output circuitry and the second die-to-die input circuitry, wherein each of the first die-to-die output circuitry and second die-to-die input circuitry are configured to selectively level shift the first signal based on whether the first supply voltage terminal or the second supply voltage terminal is connected to the reference terminal, and the second internal logic can be configured to provide a second signal to the first internal logic via the second die-to-die output circuitry and the first die-to-die input circuitry, wherein each of the second die-to-die output circuitry and first die-to-die input circuitry are configured to selectively level shift the second signal based on whether the first supply voltage terminal or the second supply voltage terminal is connected to the reference terminal.

In other aspects, if the second supply voltage terminal is connected to the reference terminal, the first internal logic can be configured to provide the first signal at the first internal voltage level to the first die-to-die output circuitry, the first die-to-die output circuitry can be configured to up shift the first signal from the first internal voltage level to the second internal voltage level and provide the down-shifted first signal to the second die-to-die input circuitry, the second die-to-die input circuitry buffers the up-shifted first signal at the second internal voltage level to the second internal logic, and the second internal logic can be configured to provide the second signal at the second internal voltage level to the second die-to-die output circuitry which can be configured to provide the second signal to the first die-to-die input circuitry without level shifting the second signal, and the first die-to-die input circuitry can be configured to down shift the second signal from the second internal voltage level to the first internal voltage level and provide the up-shifted second signal to the first internal logic.

In other aspects, if the first supply voltage terminal is connected to the reference terminal, the second internal logic can be configured to provide the second signal at the second internal voltage level to the second die-to-die output circuitry, the second die-to-die output circuitry can be configured to up shift the second signal from the second internal voltage level to the first internal voltage level and provide the down-shifted second signal to the first die-to-die input circuitry, the first die-to-die input circuitry buffers the up-shifted second signal at the first internal voltage level to the first internal logic, and the first internal logic can be configured to provide the first signal at the first internal voltage level to the first die-to-die output circuitry which can be configured to provide the first signal to the second die-to-die input circuitry without level shifting the first signal, and the second die-to-die input circuitry can be configured to down shift the first signal from the first internal voltage level to the second internal voltage level and provide the up-shifted first signal to the second internal logic In further selected embodiments, a system in a package (SIP) can comprise a first die (102) having a first supply voltage terminal (VDDI1) configured to provide a first internal voltage level, first die-to-die output circuitry (108), first die-to-die input circuitry (110), and first internal logic (106) coupled to the first supply voltage terminal. A second die can have a second supply voltage terminal (VDDI2) configured to provide a second internal voltage level. Second die-to-die output circuitry (114), second die-to-die input circuitry (112), and second internal logic (116) can be coupled to the second supply voltage terminal. The first internal logic can be configured to provide a first signal to the second internal logic via the first die-to-die output circuitry and the second die-to-die input circuitry. The first die-to-die output circuitry can be configured to not level shift the first signal when the first internal voltage level is greater than the second internal voltage level and up shift the first signal when the second internal voltage level is greater than the first internal voltage level, the second die-to-die input circuitry can be configured to down shift the first signal when the first internal voltage level is greater than the second internal voltage level and not level shift the first signal when the second internal voltage level is greater than the first internal voltage level. The second internal logic can be configured to provide a second signal to the first internal logic via the second die-to-die output circuitry and the first die-to-die input circuitry. The second die-to-die output circuitry can be configured to not level shift the second signal when the second internal voltage level is greater than the first internal voltage level and up shift the second signal when the first internal voltage level is greater than the second internal voltage level and first die-to-die input circuitry can be configured to down shift the first signal when the second internal voltage level is greater than the first internal voltage level and to not level shift the second signal when the first internal voltage level is greater than the second internal voltage level.

In other aspects, a first power terminal of each of the first die-to-die output circuitry and first die-to-die input circuitry can be coupled to the first supply voltage terminal and a first power terminal of the second die-to-die output circuitry and second die-to-die input circuitry can be coupled to the second supply voltage terminal.

In other aspects, the first die can further comprise first selection circuitry configured to couple the second power supply voltage terminal to a second power terminal of each of the first die-to-die output circuitry and first die-to-die input circuitry when the first internal voltage level is greater than the second voltage level, and couple the first power supply voltage terminal to the second power terminal of each of the first die-to-die output circuitry and first die-to-die input circuitry when the second internal voltage level is greater than the first voltage level. The second die can further comprise second selection circuitry configured to couple the first supply voltage terminal to a second power supply terminal of each of the second die-to-die output circuitry and second die-to-die input circuitry when the second internal voltage level is greater than the first voltage level, and couple the second power supply voltage terminal to the second power terminal of each of the second die-to-die output circuitry and second die-to-die input circuitry when the first internal voltage level is greater than the second voltage level.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system in a package (SIP), comprising:
   a first die having:
      a first supply voltage terminal configured to provide a first internal voltage level,
      first die-to-die output circuitry,
      first die-to-die input circuitry, and
      first internal logic coupled to the first supply voltage terminal; and
   a second die having:
      a second supply voltage terminal configured to provide a second internal voltage level;
      second die-to-die output circuitry,
      second die-to-die input circuitry, and
      second internal logic coupled to the second supply voltage terminal;
   wherein the first internal logic is configured to provide a first signal to the second internal logic via the first die-to-die output circuitry and the second die-to-die input circuitry, wherein each of the first die-to-die output circuitry and second die-to-die input circuitry are configured to selectively level shift the first signal based on the first and second internal voltage levels, and
   wherein the second internal logic is configured to provide a second signal to the first internal logic via the second die-to-die output circuitry and the first die-to-die input circuitry, wherein each of the second die-to-die output circuitry and first die-to-die input circuitry are configured to selectively level shift the second signal based on the first and second internal voltage levels.

2. The SIP of claim 1, wherein a first power terminal of each of the first die-to-die output circuitry and first die-to-die input circuitry is coupled to the first supply voltage terminal and a first power terminal of the second die-to-die output circuitry and second die-to-die input circuitry is coupled to the second supply voltage terminal.

3. The SIP of claim 2, wherein the first die further comprises:
   first selection circuitry configured to, based on the first and second internal voltage levels, couple one of the first supply voltage terminal or the second supply voltage terminal to a second power terminal of each of the first die-to-die output circuitry and first die-to-die input circuitry, and
   wherein the second die further comprises:
      second selection circuitry configured to, based on the first and second internal voltage levels, couple one of the first supply voltage terminal or the second supply voltage terminal to a second power supply terminal of each of the second die-to-die output circuitry and second die-to-die input circuitry.

4. The SIP of claim 3, wherein when the second internal voltage level is greater than the first internal voltage level:
   the first selection circuitry is configured to couple the second supply voltage terminal to the second power terminal of each of the first die-to-die output circuitry and first die-to-die input circuitry, and
   the second selection circuitry is configured to couple the second supply voltage terminal to the second power terminal of each of the second die-to-die output circuitry and second die-to-die input circuitry.

5. The SIP of claim 4, wherein when the second internal voltage level is greater than the first internal voltage level:
   the first selection circuitry is configured to also decouple the first supply voltage terminal from the second power terminal of each of the first die-to-die output circuitry and first die-to-die input circuitry, and
   the second selection circuitry is configured to also decouple the first supply voltage terminal from the second power terminal of each of the second die-to-die output circuitry and second die-to-die input circuitry.

6. The SIP of claim 4, wherein when the second internal voltage level is greater than the first internal voltage level,
   the first die-to-die output circuitry is configured to up shift the first signal from the first internal voltage level to the second internal voltage level prior to providing the first signal to the second die-to-die input circuitry, and
   the second die-to-die input circuitry provides the first signal to the second internal logic without level shifting the first signal.

7. The SIP of claim 6, wherein when the second internal voltage level is greater than the first internal voltage level,
   the second die-to-die output circuitry is configured to provide the second signal at the second internal voltage level without level shifting, and
   the first die-to-die input circuitry is configured to down shift the second signal from the second internal voltage level to the first internal voltage level prior to providing the second signal to the first internal logic.

8. The SIP of claim 6, wherein when the first internal voltage level is greater than the second internal voltage level,
   the second die-to-die output circuitry is configured to up shift the second signal from the second internal voltage level to the first internal voltage level prior to providing the second signal to the first die-to-die input circuitry, and
   the first die-to-die input circuitry provides the second signal to the first internal logic without level shifting the second signal.

9. The SIP of claim 8, wherein when the first internal voltage level is greater than the second internal voltage level, the first die-to-die output circuitry is configured to provide the first signal at the first internal voltage level without level shifting, and the second die-to-die input circuitry is configured to down shift the first signal from the first internal voltage level to the second internal voltage level prior to providing the first signal to the second internal logic.

10. The SIP of claim 3, wherein when the first internal voltage level is greater than the second internal voltage level:

the first selection circuitry is configured to couple the first supply voltage terminal to the second power terminal of each of the first die-to-die output circuitry and first die-to-die input circuitry, and the second selection circuitry is configured to couple the first supply voltage terminal to the second power terminal of each of the second die-to-die output circuitry and second die-to-die input circuitry.

11. The SIP of claim 2, wherein:

the first selection circuitry comprises:
a first switch configured to selectively couple the first supply voltage terminal to the second power terminal of each of the first die-to-die input circuitry and the first die-to-die output circuitry,
a second switch configured to selectively couple the second supply voltage terminal to the second power terminal of each of the first die-to-die input circuitry and the first die-to-die output circuitry, and the second selection circuitry comprises:
a first switch configured to selectively couple the second supply voltage terminal to the second power terminal of each of the second die-to-die input circuitry and the second die-to-die output circuitry, and
a second switch configured to selectively couple the first supply voltage terminal to the second power terminal of each of the second die-to-die input circuitry and the second die-to-die output circuitry.

12. The SIP of claim 11, wherein when the second internal voltage level is greater than the first internal voltage level:

the first selection circuitry is configured to close the second switch of the first selection circuitry and open the first switch of the first selection circuitry, and the second selection circuitry is configured to close the first switch of the second selection circuitry and open the second switch of the second selection circuitry.

13. The SIP of claim 12, wherein when the first internal voltage level is greater than the second internal voltage level:

the first selection circuitry is configured to open the second switch of the first selection circuitry and close the first switch of the first selection circuitry, and the second selection circuitry is configured to open the first switch of the second selection circuitry and close the second switch of the second selection circuitry.

14. A system in a package (SIP), comprising:
a first die having:
a first supply voltage terminal configured to provide a first internal voltage level,
first die-to-die output circuitry having a first power terminal and a second power terminal,
first die-to-die input circuitry having a first power terminal and a second power terminal, and
first internal logic coupled to the first supply voltage terminal;
a second die having:
a second supply voltage terminal configured to provide a second internal voltage level;

second die-to-die output circuitry having a first power terminal and a second power terminal,
second die-to-die input circuitry having a first power terminal and a second power terminal, and
second internal logic coupled to the second supply voltage terminal; and
a reference terminal external to the first and second die, wherein the first power terminal of each of the first die-to-die output circuitry and first die-to-die input circuitry is coupled to the first supply voltage terminal, the first power terminal of the second die-to-die output circuitry and second die-to-die input circuitry is coupled to the second supply voltage terminal, and the second power terminal of each of the first die-to-die output circuitry, first die-to-die input circuitry, second die-to-die output circuitry, and second die-to-die input circuitry is coupled to the reference terminal.

15. The SIP of claim 14, wherein:

the first internal logic is configured to provide a first signal to the second internal logic via the first die-to-die output circuitry and the second die-to-die input circuitry, wherein each of the first die-to-die output circuitry and second die-to-die input circuitry are configured to selectively level shift the first signal based on whether the first supply voltage terminal or the second supply voltage terminal is connected to the reference terminal, and the second internal logic is configured to provide a second signal to the first internal logic via the second die-to-die output circuitry and the first die-to-die input circuitry, wherein each of the second die-to-die output circuitry and first die-to-die input circuitry are configured to selectively level shift the second signal based on whether the first supply voltage terminal or the second supply voltage terminal is connected to the reference terminal.

16. The SIP package of claim 15, wherein if the second supply voltage terminal is connected to the reference terminal:

the first internal logic is configured to provide the first signal at the first internal voltage level to the first die-to-die output circuitry, the first die-to-die output circuitry is configured to up shift the first signal from the first internal voltage level to the second internal voltage level and provide the down-shifted first signal to the second die-to-die input circuitry, the second die-to-die input circuitry buffers the up-shifted first signal at the second internal voltage level to the second internal logic, and the second internal logic is configured to provide the second signal at the second internal voltage level to the second die-to-die output circuitry which is configured to provide the second signal to the first die-to-die input circuitry without level shifting the second signal, and the first die-to-die input circuitry is configured to down shift the second signal from the second internal voltage level to the first internal voltage level and provide the up-shifted second signal to the first internal logic.

17. The SIP package of claim 15, wherein if the first supply voltage terminal is connected to the reference terminal:

the second internal logic is configured to provide the second signal at the second internal voltage level to the second die-to-die output circuitry, the second die-to-die output circuitry is configured to up shift the second signal from the second internal voltage level to the first internal voltage level and provide the down-shifted second signal to the first die-to-die input circuitry, the first die-to-die input circuitry buffers the up-shifted second signal at the first internal voltage level to the first internal logic, and the first internal logic is configured to provide the first signal at the first internal voltage level to the first die-to-die output circuitry which is configured to provide the first signal to the second die-to-die input circuitry without level shifting the first signal, and the second die-to-die input circuitry is configured to down shift the first signal from the first internal voltage level to the second internal voltage level and provide the up-shifted first signal to the second internal logic.

18. A system in a package (SIP), comprising:
a first die having:
    a first supply voltage terminal configured to provide a first internal voltage level,
    first die-to-die output circuitry,
    first die-to-die input circuitry, and
    first internal logic coupled to the first supply voltage terminal; and
a second die having:
    a second supply voltage terminal configured to provide a second internal voltage level;
    second die-to-die output circuitry,
    second die-to-die input circuitry, and
    second internal logic coupled to the second supply voltage terminal;
wherein the first internal logic is configured to provide a first signal to the second internal logic via the first die-to-die output circuitry and the second die-to-die input circuitry, wherein:
    the first die-to-die output circuitry is configured to not level shift the first signal when the first internal voltage level is greater than the second internal voltage level and up shift the first signal when the second internal voltage level is greater than the first internal voltage level,
    the second die-to-die input circuitry is configured to down shift the first signal when the first internal voltage level is greater than the second internal voltage level and not level shift the first signal when the second internal voltage level is greater than the first internal voltage level, and wherein the second internal logic is configured to provide a second signal to the first internal logic via the second die-to-die output circuitry and the first die-to-die input circuitry, wherein:
    the second die-to-die output circuitry is configured to not level shift the second signal when the second internal voltage level is greater than the first internal voltage level and up shift the second signal when the first internal voltage level is greater than the second internal voltage level
    and first die-to-die input circuitry is configured to down shift the first signal when the second internal voltage level is greater than the first internal voltage level and to not level shift the second signal when the first internal voltage level is greater than the second internal voltage level.

19. The SIP of claim 18, wherein a first power terminal of each of the first die-to-die output circuitry and first die-to-die input circuitry is coupled to the first supply voltage terminal and a first power terminal of the second die-to-die output circuitry and second die-to-die input circuitry is coupled to the second supply voltage terminal.

20. The SIP of claim 19, wherein the first die further comprises:
    first selection circuitry configured to couple the second power supply voltage terminal to a second power terminal of each of the first die-to-die output circuitry and first die-to-die input circuitry when the first internal voltage level is greater than the second voltage level, and couple the first power supply voltage terminal to the second power terminal of each of the first die-to-die output circuitry and first die-to-die input circuitry when the second internal voltage level is greater than the first voltage level, and
wherein the second die further comprises:
    second selection circuitry configured to couple the first supply voltage terminal to a second power supply terminal of each of the second die-to-die output circuitry and second die-to-die input circuitry when the second internal voltage level is greater than the first voltage level, and couple the second power supply voltage terminal to the second power terminal of each of the second die-to-die output circuitry and second die-to-die input circuitry when the first internal voltage level is greater than the second voltage level.

* * * * *